United States Patent [19]

Zimmer

[11] Patent Number: 4,939,341
[45] Date of Patent: Jul. 3, 1990

[54] HEATED TOOL WITH MULTIPLE HEATING SURFACES

[75] Inventor: Gero Zimmer, Munich, Fed. Rep. of Germany

[73] Assignee: Productech Inc., Rolling Hills Estates, Calif.

[21] Appl. No.: 275,331

[22] Filed: Nov. 22, 1988

[30] Foreign Application Priority Data

Nov. 24, 1987 [DE] Fed. Rep. of Germany ....... 3739771

[51] Int. Cl.5 .............................................. H05B 1/00
[52] U.S. Cl. .................................... 219/243; 219/538; 219/552; 219/553
[58] Field of Search ..................... 219/243, 222, 85.16, 219/230, 238, 240, 355, 535, 538, 552, 553

[56] References Cited

U.S. PATENT DOCUMENTS 3,982,992  9/1976  Moffitt ............................ 219/243 X
4,205,221  5/1980  Meyer ................................ 219/85.16

Primary Examiner—C. L. Albritton
Attorney, Agent, or Firm—Notaro & Michalos

[57] ABSTRACT

A heating tool for heating at least one object, comprises an electrically heated U-shaped heater bar having a heat supplying contact surface for being pressed into contact with the object to be heated. A radiator is advantageously connected between arms of the U-shaped heater bar for receiving electrical current to produce radiated heat which heats another portion of the object or another object. Electricity may be provided by a single source to both the contact surface and the radiator.

14 Claims, 6 Drawing Sheets

Fig. 7a

HEATED TOOL WITH MULTIPLE HEATING SURFACES

FIELD AND BACKGROUND OF THE INVENTION

The present invention relates in general to heating tools for thermally treating objects and/or for connecting objects together by welding, soldering, or gluing. The heating tools may either be moved to the objects to be treated or mounted in a fixed position, with the objects to be treated being brought to the heated tool.

Thermal energy is either supplied to the objects to be treated (e.g. to connect them to each other), by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided for increasing the transfer of heat and for reducing oxidation during the thermal process.

Such tools may supply heat either continuously or during selected time periods only. Heat may be applied during heating pulses which may be activated or controlled by various external conditions, for example, by forcing the heated tool against the object to be heated or connected.

Various sources of heat are known for heating the heated tool to a variety of selected temperatures. Hot gases and/or electric current for example may be used for heating specified heat supplying areas or surfaces of the tool.

For the present invention, it is preferable to utilize the flow of electrical current through a heated tool for heating the tool. This permits controlled pulse-heating featuring fast heating rates as well as precise temperature control at various areas of the tool.

A known generally U-shaped heated tool is disclosed in German Patent reference 2,848,519. This heated tool is mounted to holders either using screws or by welding. This keeps the heat supplying areas of the tool in position and further is used to provide electrical connectors for feeding electrical heating current to the tool. Such tools can be manufactured using sheet metal designs (see German Pat. Nos. 3,144,048.7, 3,137,859.5 and 3,137,860.9 to the present inventor). These heated tools can also be machined from solid materials.

When transferring thermal energy to one or more objects using one or more heated tools, excess heat and relatively long periods of time are sometimes needed, particularly when the objects are made of materials having high thermal loads.

The use of force-controlled thermal contact for transferring thermal energy from a tool to a part must also be accurately controlled. For this reason force-controlled thermal contact has limited applications. Objects having high thermal conductivity, for example objects made of metal oxides, require different procedures. Continuous preheating for example may be necessary for such applications. A heating tool is simply set at a much higher temperature to compensate for thermal loads. This has limitation however in that excess heat may be damaging to some materials.

Figure 1:
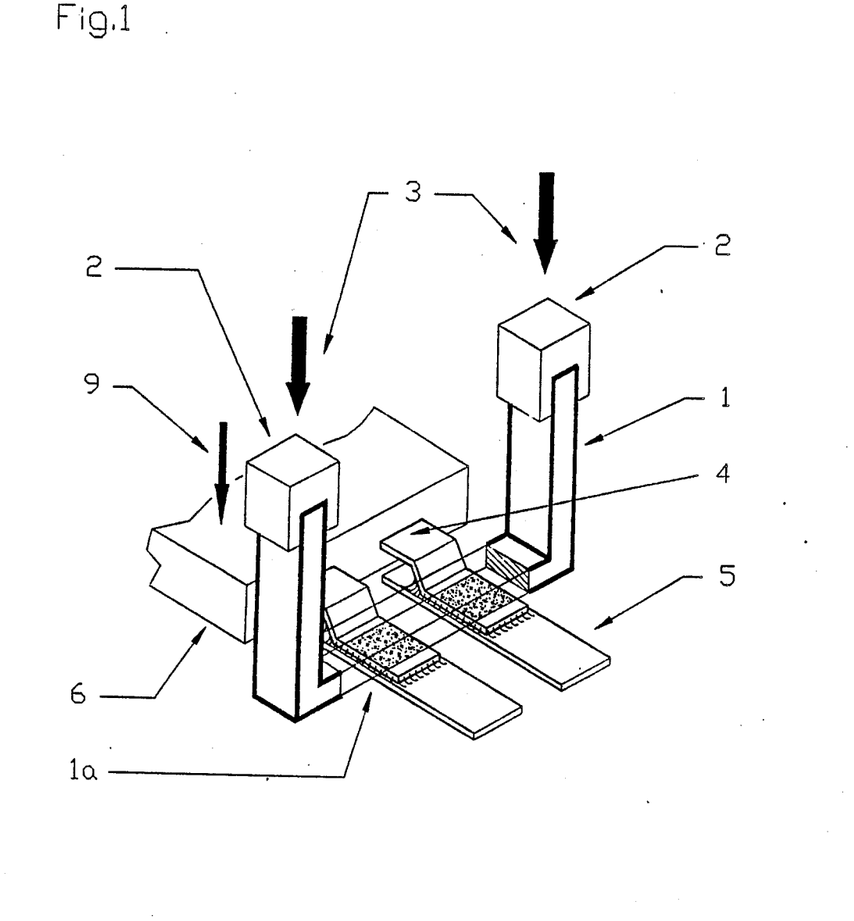
FIG. 1 is a schematic view of a known heated tool used for connecting two objects to each other.

FIG. 1 illustrates a typical configuration for connecting a first object 4, in this case a ribbon or wire extending from an electronic component 6, to a second object 5 in this case a metallization layer on a substrate 5. To this end, a heated tool 1 is applied with a force in the direction of arrows 3 against the first object 4 to heat it and press it against the second object 5. The force and heat of the heated tool 1 is intended to melt a solder coating on the first object 4 as well as a solder coating on the second object 5 in order to melt the solders and connect the objects to each other. The intention is to utilize force in the direction of arrows 3 to simultaneously melt solders to join the object.

This process becomes more critical and difficult however if substrate 5 is made of material having a high thermal load. The temperature at object 4 will lose heat through substrate 5 and therefore be cooler than heated tool 1. The wire or ribbon of object 4 represents an additional thermal resistance between heated tool 1 and object 4. In order to melt the solder below the object therefore heated tool 1 must be brought to a much higher temperature. This increases the chances of damaging sensitive nearby parts, such as the electronic component 6. This also requires excessive heat and time to make the connection.

The process of transferring thermal energy becomes more critical if high thermal loads are in contact with the heat supplying area 1a of the heated tool 1.

SUMMARY OF THE INVENTION

The present invention is based on the idea of compensating or reducing the thermal loads, while keeping control over the operating characteristics of the heated tools and their heated areas such as applied force and temperature control.

An object of the present invention, is to utilize additional thermal energy which is applied to the thermal loads. An increased temperature at the loads reduces the effects created by the thermal loads at the heat transferring area. This is done by using additional thermal radiation which is applied to these thermal loads and which therefor increases temperature at various areas of the thermal loads.

According to the present invention, shapes for the "radiators" that are utilized to produce the additional thermal radiation, are matched and applied to the thermal loads. The various characteristics of the thermal loads can therefor be compensated. The advantages of the heater bar or bars which are utilized for transferring thermal energy by direct thermal contact to the thermal loads, are not effected or reduced by the present invention.

BRIEF DESCRIPTION OF THE DRAWINGS

In the drawings:

FIG. 5 is a perspective view of the heater bar and thermal radiator of FIG. 4a;

DESCRIPTION OF THE PREFERRED EMBODIMENTS

Figure 2:
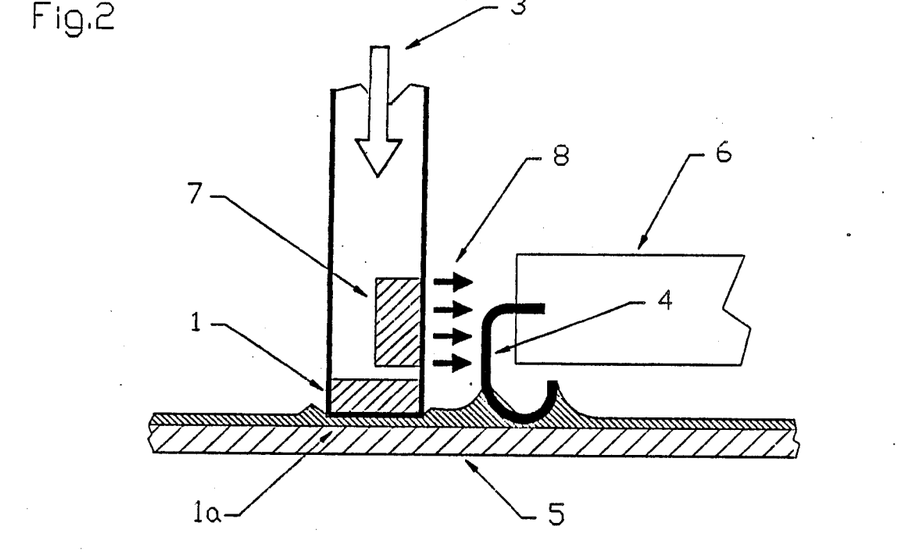
FIG. 2 is a schematic side view which explains the basic concept of the present invention.

Referring to 2, the present invention comprises an electrically heated heater bar 1 having a heat supplying area or surface 1a which is meant to be forced in the direction of arrow 3 and into contact with at least one of two objects, 4 and 5 to be connected together by heat. Object 4 is a lead in the form of a wire or ribbon which extends from a package 6 and which is to be soldered to object 5 which is a pad. The heater bar of the present invention includes an additional heat source 7 with a radiant heating surface which radiates thermal energy 8 toward the lead 4. The heating surface of source 7 is not parallel to the heating surface 1a of bar 1, but faces transversely thereto, to heat another part of the object spaced from the contact surface of bar 1. The thermal energy as well as the temperature of the heat source 7 may differ from that of the heater bar 1. For most applications, the thermal energy and temperature of the heat source 7 should be higher than that of the heater bar 1. The shape of the heat source or radiator 7 as well as its size, surface, material and location, as well as the time when the radiator is energized, can be selected to meet various requirements.

Figure 3:
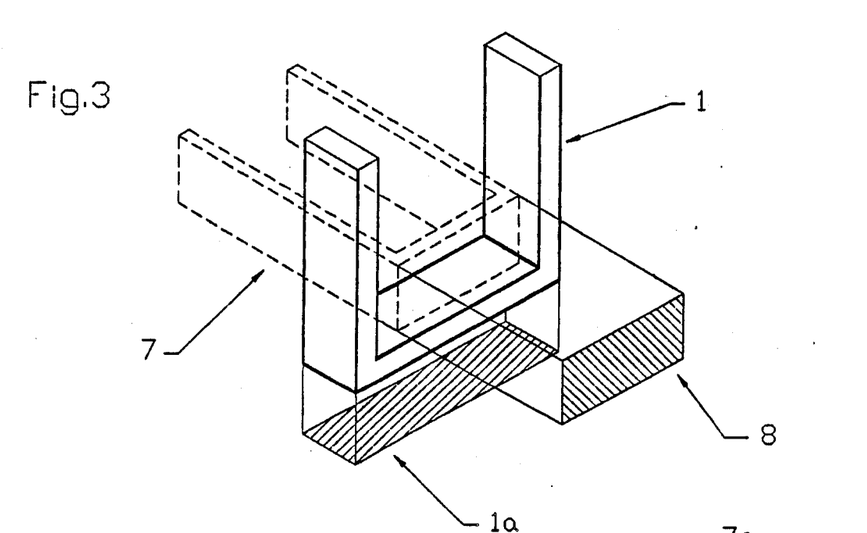
FIG. 3 is a schematic perspective view showing an apparatus of the present invention.
Figure 3A:
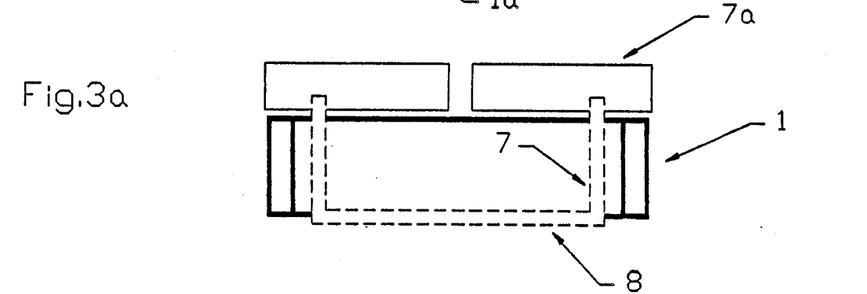
FIG. 3a is a top plan view of the embodiment of FIG. 3.
Figure 3B:
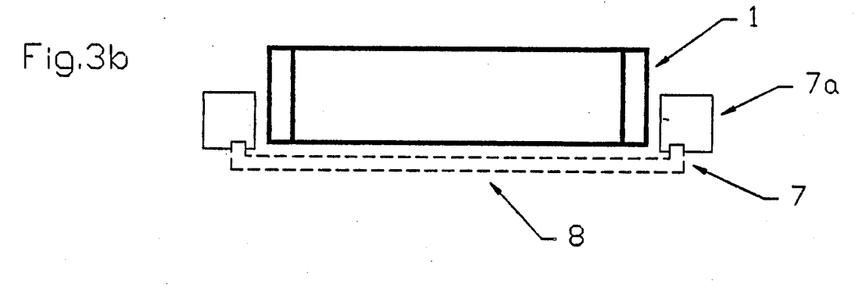
FIG. 3b is a view similar to FIG. 3a of another embodiment of the invention.

FIGS. 3, 3a and 3b show an embodiment of the invention which utilizes a separate radiator 7 for radiating heat at numeral 8. The heater bar 1 again transfers the basic thermal energy by means of thermal contact at its area or surface 1a which is thermally supported by the thermal radiating area 8 that can be located at various locations.

This configuration has the advantage of providing entirely independent and separate thermal conditions as well as thermal control. In addition, the timing for applying energy to the heater bar 1 and radiator 7 can be controlled independently from each other.

FIG. 3a shows the thermal radiator 7 being positioned inside the U-shaped heater bar 1. Electrical contact 7a are connected to opposite ends of the radiator 7 and operate similarly to the electrical contacts of the heater bar 1 which is shown in FIG. 1.

FIG. 3b shows an alternate configuration for both heat sources. The additional heater or radiator 7 is located in front of and on the outside of the heater bar 1. This configuration has the advantage of heating up a larger area by radiation.

FIGS. 4 and 4a through 4i, show various shapes and designs for the heat radiators of the present invention. In these embodiments, the radiators receive electrical energy from the same electrical source as the heater bar 1. In these examples, temperature is controlled by a single electrical source. Electrical current in the direction of arrow 9 is divided to flow through radiator 11 in FIG. 4, and through the heater bar portion 10. By changing the mechanical design of both heat sources, different temperatures may be created at the radiator and the heater bar portion.

The radiators can be positioned at various locations. Based on such locations, thermal requirements of the thermal loads can be compensated and matched.

Figures 4, 4D, 4E, 4F, 4G, 4H, 4I:
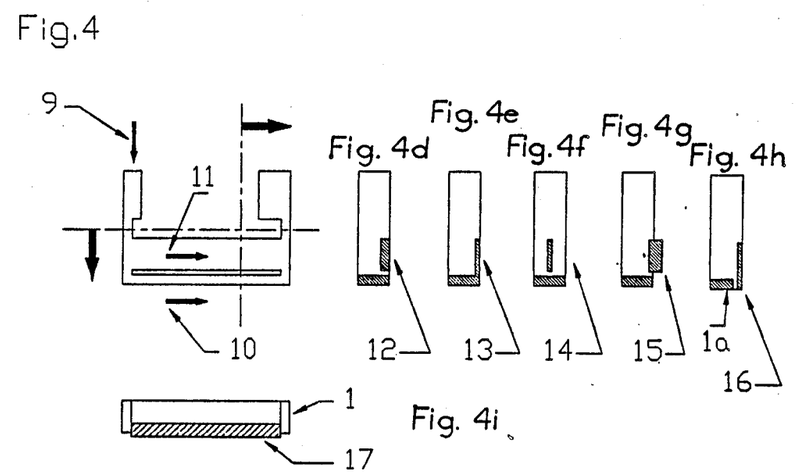
FIG. 4 is a front elevational view of a heater bar with a heat radiator which are both heated by a single electrical source, in accordance with the invention.
FIGS. 4d through 4h are sectional views of the embodiment of FIG. 4 showing various shapes and positions for the thermal radiator.
FIG. 4i is a horizontal sectional view of the embodiment of FIG. 4 showing the shape of another thermal radiator, which is similar to the embodiment of FIG. 4g.
Figures 4A, 4C:
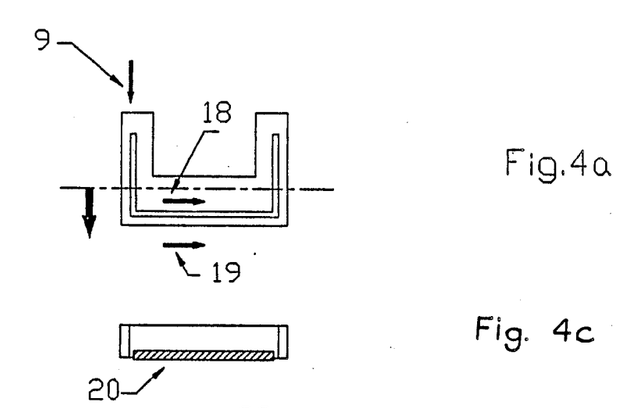
FIG. 4a is a view similar to FIG. 4 of another embodiment of the invention.
FIG. 4c is a view similar to FIG. 4b showing a different simpler shape for the radiator.
Figure 4B:
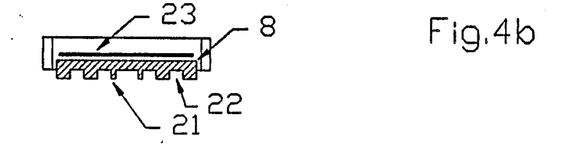
FIG. 4b is a sectional view showing a unique shape for the thermal radiator of the present invention.

FIG. 4b shows radiator 12 which is located between the arms of the heater bar at a location adjacent to but spaced from the heater bar portion which carries the heat supplying contact surface 1a.

FIG. 4e shows radiator 13 which is positioned with little or no gap with the heater bar portion.

FIG. 4f shows an embodiment wherein radiator 14 is located inside the U-shaped heater bar and between its arms.

FIG. 4g shows a radiator 15 which is located partly outside the area of the heater bar.

FIG. 4h shows heater bar 16 which almost covers one lateral face of the heater bar portion which carries the heat supplying contact surface 1a.

FIG. 4i shows a radiator 17 which illustrates a possible position for the radiator between the arms of heater bar 1.

FIG. 4a shows a different configuration of the heater bar and radiator wherein the electrical current 9 is divided prior to reaching the area of the heater bar portion and radiator. The current is divided into flow paths 18 and 19 which has the advantage of permitting more independent thermal energy to the heat supplying contact surface and the radiator. This permits adapting the radiator and contact heater to different thermal loads and also permits the use of an entirely different thermal control circuitry.

FIG. 4c shows a sectional view of radiator 20 which is one possible shape for the radiator of FIG. 4a. FIG. 4b shows radiator which has a different shape for the radiation supplying area 8. The radiator includes slots 22 as well as bars 21 which may be matched to meet thermal and mechanical requirements of the thermal loads 4 or 5. This permits an increased thermal heat transfer.

A heat insulated layer 23 may also be provided behind the radiator to prevent the radiation of heat to areas where it is not desired. This saves thermal energy as well as avoiding the heating of areas where heat is not wanted.

Figure 5:
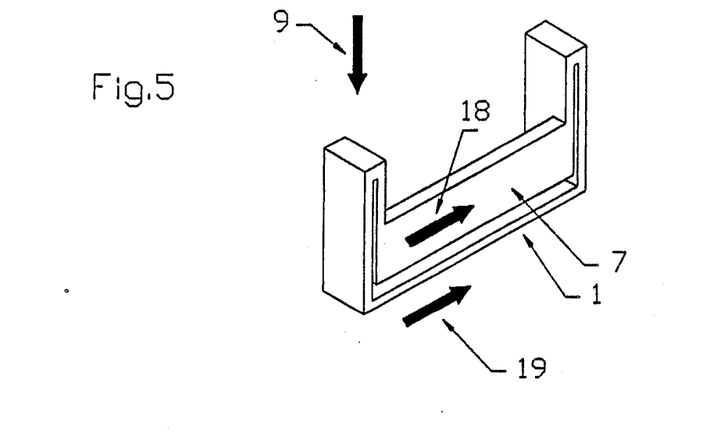

FIG. 5 shows the U-shaped configuration for both the heater bar 1 and the radiator 7.

Figure 5A:
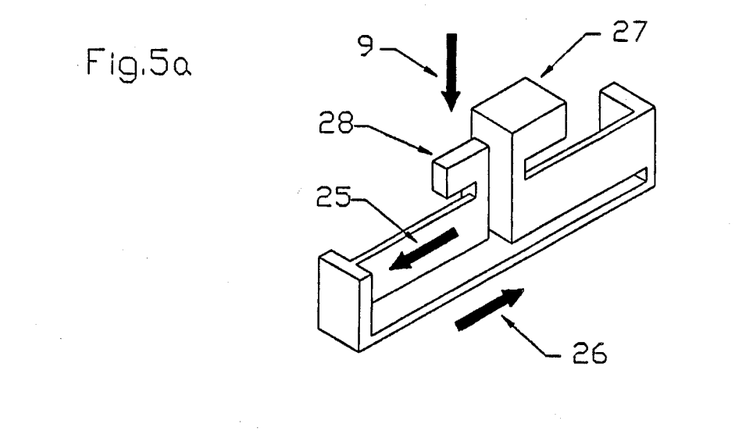
FIG. 5a is a perspective view of a further embodiment of the invention which utilizes two different thermal radiators powered by the same current supply.

FIG. 5a shows an embodiment of the invention wherein the radiator is divided into two different parts which are both supplied with the same electrical current 9 as the heater bar. The electricity flows first through the radiator in the direction of arrow 25 then through the heater bar in the direction of arrow 26, in series. Electrical connectors 27 and 28 may also be provided to have different shapes adapted to the size, position in configuration of the split radiator.

Figure 6:
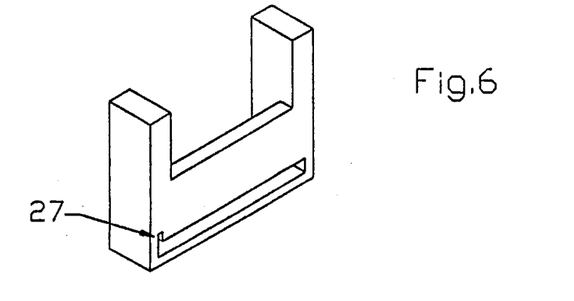
FIG. 6 is a perspective view of an embodiment of the invention similar to that shown in FIG. 5.

FIG. 6 shows an embodiment of the invention which is similar to that of FIG. 4 but which includes a cut out 27 that partly isolates the radiator from the rest of the heater bar to better control the flow of electricity through the radiator.

Figure 7:
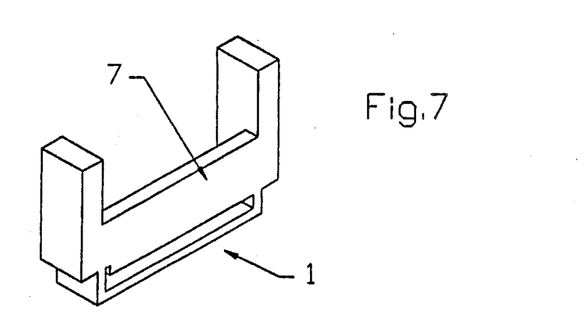
FIG. 7 is a perspective view of a further embodiment of the invention.

FIG. 7 shows an embodiment similar to that of FIG. 6 wherein the heat supplying contact area of the heater bar 1 has different mechanical and dimensional characteristics from that of the radiator 7 which may be longer than or shorter than the heat supplying contact surface.

Figure 7A:
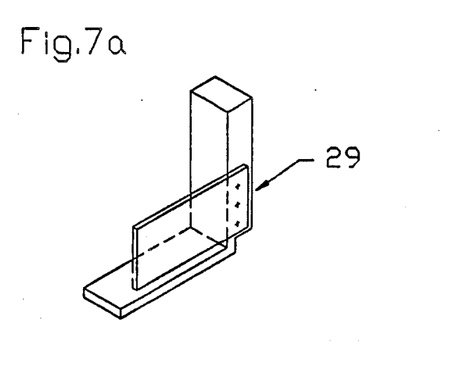
FIG. 7a shows an alternate mounting arrangement for the radiator of the present invention.

FIG. 7a shows a manner of mounting a radiator at 29 which may be by welding to provide a radiator that is made of a different structural part from the heater bar.

Figure 7B:
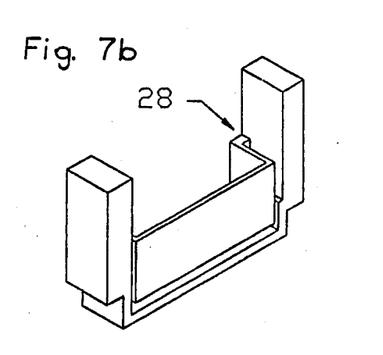
FIG. 7b is a perspective view of a further embodiment of the invention.

FIG. 7b shows an embodiment of the invention wherein radiator 28, also made of a different part from the heater bar, is mounted between the arms of the heater bar. The radiators of FIGS. 7a and 7b may also be made of different material from that of the heater bar.

Figure 8:
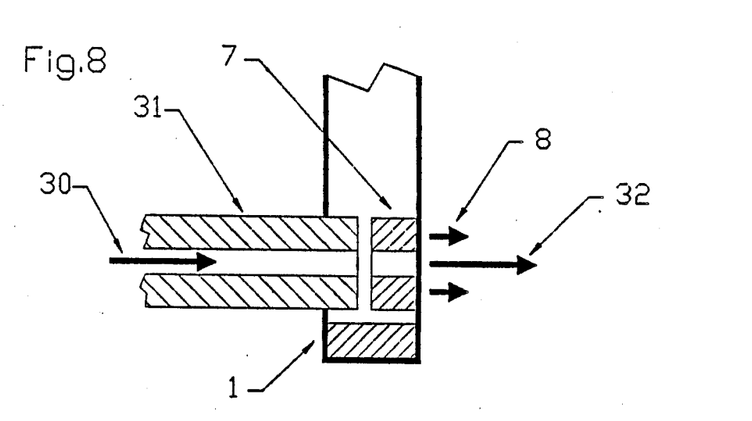
FIG. 8 is a partial sectional view showing an embodiment of the invention using a thermal radiator and a nozzle for providing a flow of gas.

FIG. 8 shows an embodiment of the invention wherein the radiator 7 is used in conjunction with a nozzle 31 for supplying a flow of additional gas 30 toward or through radiator 7. To this end, radiator 7 may include an aperture through which the gas flows in the direction of arrow 32 to provide additional thermal energy to the radiant energy 8 from the radiator 7. The additional flow of gas may also be used for cooling and controlling the radiator to a preset temperature required. The gas may be utilized to this end after completion of the entire heat treatment cycle.

What is claimed is:

1. A heating tool for heating at least one object, comprising:
    an electrically heated heater bar having a heat supplying contact surface for being pressed into contact with at least one object to be heated;
    an electrically heated radiator having a radiant surface for radiating heat at at least one object to be heated, the radiator being positioned near the contact surface and the radiant surface being spaced from and facing substantially transversely to the contact surface; and
    electrical current supplying means connected to the heater bar and the radiator for supplying electrical current thereto.

2. A tool according to claim 1 wherein said electrical current supplying means comprises separate contacts connected to said heater bar and to said radiator for separately supplying and controlling electrical current to said contact surface and radiator.

3. A heating tool for heating at least one object, comprising:
    an electrically heated heater bar having a heat supplying contact surface for being pressed into contact with at least one object to be heated;
    an electrically heated radiator for radiating heat at least one object to be heated, positioned near the contact surface, said radiator and said heater bar being mechanically separate from each other and movable with respect to each other; and
    electrical current supplying means connected to the heater bar and the radiator for supplying electrical current thereto, said electrical current supplying means comprising separate contacts connected to said heater bar and to said radiator for separately supplying and controlling electrical current to said contact surface and radiator.

4. A tool according to claim 1 wherein said radiator is operatively connected to said heater bar, said electrical current supplying means comprising contacts connected to said heater bar for supplying current both to said contact surface and to said radiator.

5. A toll according to claim 4 wherein said radiator extends parallel to the contact surface and is spaced from the contact surface.

6. A tool according to claim 5 wherein said radiator is spaced by a gap from a portion of said heater bar which carries said contact surface.

7. A heating tool for heating at least one object, comprising:
    an electrically heated heater bar having a heat supplying contact surface for being pressed into contact with at least one object to be heated;
    an electrically heated radiator for radiating heat at at least one object to be heated, positioned near the contact surface, said radiator extending parallel to the contact surface and being spaced from the contact surface and being spaced by a gap from a portion of said heater bar which carries said contact surface; and
    electrical current supplying means connected to the heater bar and the radiator for supplying electrical current thereto;
    said radiator being operatively connected to said heater bar, said electrical current supplying means comprising contacts connected to said heater bar for supplying current both to said contact surface and to said radiator, said heater bar being U-shaped and having a pair of arms for connection to said electrical current supplying means, said radiator being connected between said arms.

8. A heating tool for heating at least one object, comprising:
    an electrically heated heater bar having a heat supplying contact surface for being pressed into contact with at least one object to be heated;
    an electrically heated radiator for radiating heat at at least one object to be heated, positioned near the contact surface; and
    electrical current supplying means connected to the heater bar and the radiator for supplying electrical current thereto;
    said radiator and said heater bar both being U-shaped and being connected to each other at opposite ends, said electrical current supplying means comprising contacts connected to said opposite ends of said heater bar and radiator.

9. A heating tool for heating at least one object, comprising:
    an electrically heated heater bar having a heat supplying contact surface for being pressed into contact with at least one object to be heated:
    an electrically heated radiator operatively connected to the heater bar for radiating heat at at least one object to be heated, positioned near and spaced from the contact surface and extending parallel to the contact surface, said radiator comprising a plurality of bars and grooves for distributing radiated heat from said radiator; and
    electrical current supplying contacts connected to the heater bar for supplying electrical current both to said contact surface and to said radiator.

10. A heating tool for heating at least one object, comprising:
   an electrically heated heater bar having a heat supplying contact surface for being pressed into contact with at least one object to be heated;
   an electrically heated radiator operatively connected to the heater bar for radiating heat at at least one object to be heated, positioned near and spaced from the contact surface and extending parallel to the contact surface, said heater bar including a pair of arms, said radiator being connected between said pair of arms and including a slot partly separating at least one end of said radiator from at least one arm of said heater bar; and
   electrical current supplying contacts connected to the heater bar for supplying electrical current both to said contact surface and to said radiator.

11. A tool according to claim 1 wherein said radiator is made of a different structural part from said heater bar, said radiator being fixed to said heater bar.

12. A heating tool for heating at least one object, comprising:
   an electrically heated heater bar having a heat supplying contact surface for being pressed into contact with at least one object to be heated;
   an electrically heated radiator for radiating heat at at least one object to be heated, positioned near the contact surface;
   electrical current supplying means connected to the heater bar and the radiator for supplying electrical current thereto; and
   said heater bar including a pair of arms, said contact surface extending between said arms, said radiator comprising first and second portions extending substantially parallel to each other and parallel to the contact surface, each portion of said radiator being connected to one of said arms of said heater bar, said electrical current supplying means comprising a contact connected to each of said portions for supplying current to said portions and, in series, to said heater bar for heating said contact surface thereof.

13. A heating tool for heating at least one object, comprising:
   an electrically heated heater bar having a heat supplying contact surface for being pressed into contact with at least one object to be heated;
   an electrically heated radiator for radiating heat at at least one object to be heated, positioned near the contact surface;
   electrical current supplying means connected to the heater bar and the radiator for supplying electrical current thereto; and
   gas supply means being operatively connected to said heater bar for supplying gas toward said radiator for modifying the heating of said radiator.

14. A tool according to claim 13 including an aperture through said radiator, said gas supplying means comprising a nozzle for directing gas towards said aperture.

* * * * *